(12) United States Patent
Pratt et al.

(10) Patent No.: US 7,532,696 B2
(45) Date of Patent: May 12, 2009

(54) CALIBRATION DEVICE FOR A PHASED LOCKED LOOP SYNTHESISER

(75) Inventors: Patrick J. Pratt, Mallow (IE); Michael A. Milyard, Chandler, AZ (US); Louis M. Nigra, Chicago, IL (US); Daniel B. Schartz, Gold Canyon, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 646 days.

(21) Appl. No.: 10/991,811

(22) Filed: Nov. 18, 2004

(65) Prior Publication Data

US 2005/0151595 A1 Jul. 14, 2005

(30) Foreign Application Priority Data

Nov. 18, 2003 (GB) ................. 0326861.2

(51) Int. Cl.
*H03D 3/24* (2006.01)
(52) U.S. Cl. ................ 375/376; 375/302; 375/215; 375/373; 375/375; 327/156; 455/180.3
(58) Field of Classification Search ........... 375/215, 375/373, 375; 455/180.3; 327/156
See application file for complete search history.

(56) References Cited

U.S. PATENT DOCUMENTS

| | | | |
|---|---|---|---|
| 4,785,411 A * | 11/1988 | Thompson et al. ......... 708/322 |
| 5,546,459 A * | 8/1996 | Sih et al. ............... 379/406.09 |
| 5,809,074 A * | 9/1998 | Werner et al. ............... 375/233 |
| 5,901,346 A * | 5/1999 | Stengel et al. ............. 455/126 |
| 5,990,734 A * | 11/1999 | Wright et al. ................ 330/2 |
| 5,995,541 A | 11/1999 | Navid et al. |
| 6,088,389 A * | 7/2000 | Larsson ..................... 375/231 |
| 6,118,811 A | 9/2000 | Narumi et al. |
| 6,515,553 B1 | 2/2003 | Filiol et al. |
| 6,570,910 B1 * | 5/2003 | Bottomley et al. ........ 375/148 |
| 6,731,712 B1 | 5/2004 | Lindstrom |
| 7,002,417 B2 * | 2/2006 | Maunuksela et al. ....... 331/17 |
| 2003/0030425 A1 | 2/2003 | Delbo |

FOREIGN PATENT DOCUMENTS

EP 0910170 A2 4/1999

* cited by examiner

*Primary Examiner*—Shuwang Liu
*Assistant Examiner*—Lihong Yu

(57) ABSTRACT

A calibration device for a phase locked loop arranged to generate an output frequency based upon a first frequency range of an input signal applied to a first input and a second frequency range of the input signal applied to a second input, the calibration phase locked loop synthesizer device comprising an estimator arranged to use a two dimensional estimation algorithm with a signal value indicative of a mismatch between the first input path and the second input path to determine an estimate of the mismatch to allow matching of the first input path and the second input path.

6 Claims, 2 Drawing Sheets

CALIBRATION DEVICE FOR A PHASED LOCKED LOOP SYNTHESISER

The present invention relates to a calibration device for a phase locked loop synthesizer and a method for calibrating a phase locked loop synthesizer.

A digital modulation technique that is becoming increasingly popular in wireless transmitters is the use of polar modulation in which a modulating signal is separated into an amplitude component and a phase/frequency component.

One technique for digitally modulating the phase/frequency component involves the use of a phase locked loop PLL synthesizer where a reference frequency is modulated with the phase/frequency component of the modulating signal.

However, for data rates in excess of 100 Kb/s techniques involving direct modulation of a PLL synthesizer begin to fail due to the high loop bandwidth requirements. One solution to this problem has involved the use of a dual port PLL synthesizer where a high frequency modulation path feeds directly to a voltage controlled oscillator VCO and a low frequency modulation path is applied to a reference signal. As such, the high frequency component of an input signal is added directly to the VCO, whereas the low frequency component is added by modulating the reference signal.

Consequently, a dual port PLL synthesizer presents a low pass filter response to the low frequency component while presenting a high pass filter response to the high frequency component.

As such, the transfer function H(w) for the low frequency component is relatively flat up to the resonant frequency of the PLL synthesizer while the transfer function 1-H(w) for the high frequency component is relatively flat for frequencies above the resonant frequency.

However, to ensure modulation accuracy and suppression of unwanted emissions calibration of a polar transmitter is required. In particular, gain and time alignment between the high frequency path and low frequency path of a dual port PLL is required to satisfy error vector magnitude EVM and adjacent channel power rejection ACPR specifications for mobile phone standards. Further, time alignment between the amplitude modulation path and phase/frequency modulation path is also required.

Gain and time alignment calibration can be performed off-line as part of a factory calibration. However, as the dynamics of the amplitude modulation path and the phase/frequency path can change with temperature, supply conditions and in the case of gain with frequency, off-line calibration is undesirable.

In accordance with a first aspect of the present invention there is provided a phase locked loop synthesizer according to claim 1.

This provides the advantage of allowing gain and time alignment to be calibrated autonomously and in the same process.

In accordance with a second aspect of the present invention there is provided a method for calibrating a phase locked loop synthesizer according to claim 5.

An embodiment of the invention will now be described, by way of example, with reference to the drawings, of which:

Figure 1:
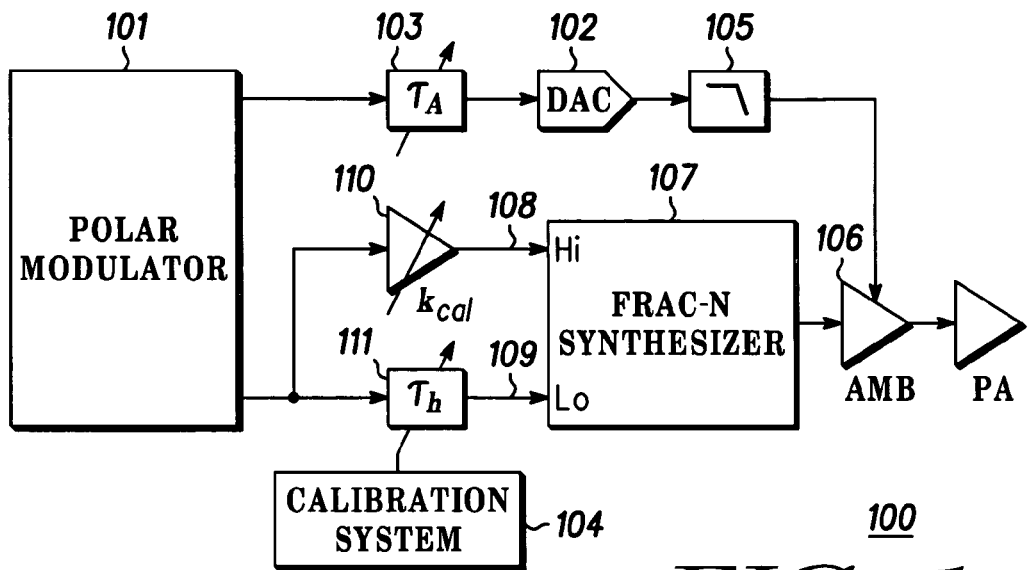
FIG. 1 illustrates a polar transmitter according to an embodiment of the present invention.

FIG. 1 shows a polar transmitter 100. The polar transmitter 100 includes a polar modulator 101 having a digital amplitude modulated AM output and digital phase modulated PM output.

The polar modulator AM output is coupled to a digital analogue converter DAC 102, for converting a digital output signal to an analogue signal, via a first programmable digital time delay element 103. The time delay of the programmable time delay element 103 is set via a calibration module 104, as describe below. The DAC output is coupled to a low pass filter 105, for removing unwanted signal images from an AM signal, which is coupled to an AM buffer 106.

The polar modulator PM output is coupled to a dual port synthesiser 107 having a high input port 108 and a low input port 109, where the PM output is coupled to the high input port 108 via a programmable digital gain element 110 and the low input port 109 via a second programmable digital time delay element 111. The gain of the programmable gain element 110 and the time delay of the programmable time delay element 111 are set via the calibration module 104, as describe below. The dual port synthesiser 107 modulates a PM signal onto a high frequency signal and outputs the modulated high frequency signal to the AM buffer 106, where an AM signal received from the polar modulator AM output is multiplied with the modulated PM signal received from the polar modulator 101.

The polar transmitter 100 is suitable for a multi timeslot wireless system, for example a GSM mobile phone system (not shown).

The polar transmitter 100 is arranged, using the calibration module 104 as described below, to perform a time delay and gain mismatch estimation process between the high input port 108 and the low input port 109 of the dual port synthesiser 107 and a time delay mismatch estimation process between the AM path and PM path, to determine the approximate time and gain mismatch between the various paths, before transmission within an appropriate timeslot. Once the estimation processes has been completed the calibration module 104 programmes the first digital time delay element 103, the second digital time delay element 111 and the digital gain element 110 with suitable values to allow the time delays and gains of the various paths to be matched prior to the transmission.

Figure 2:
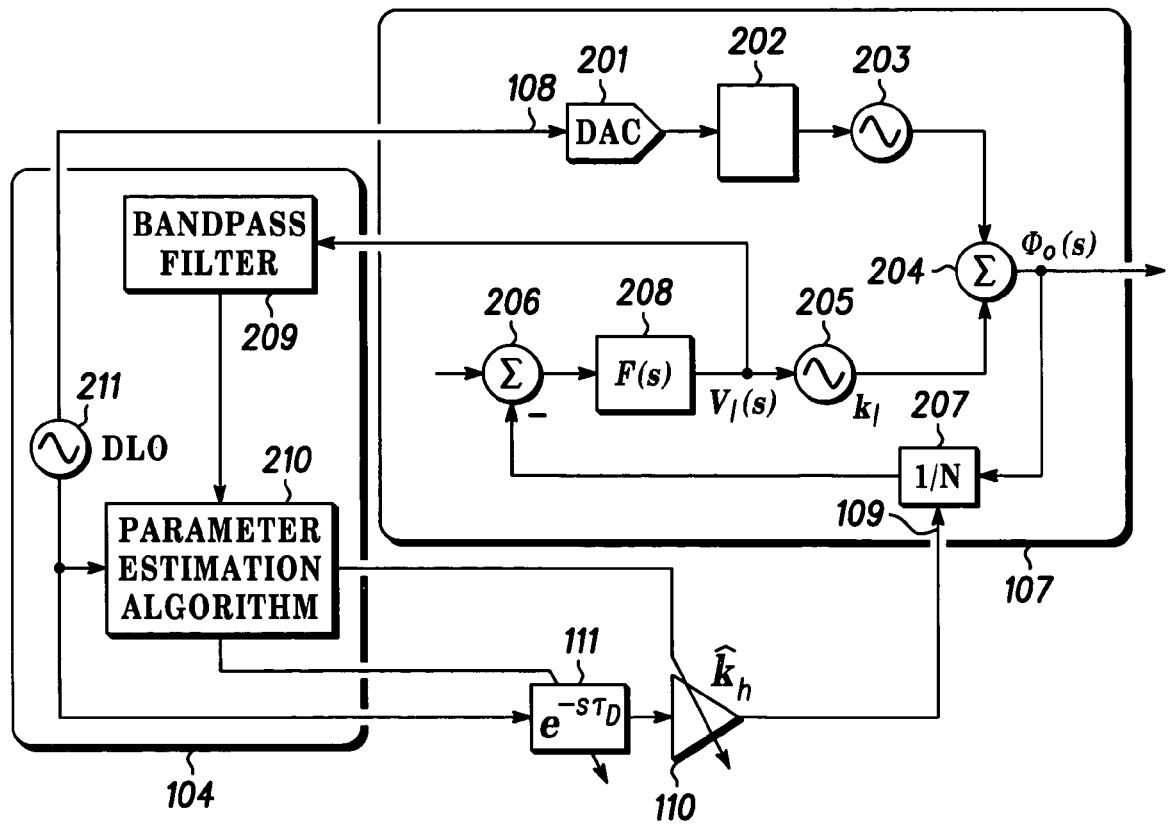
FIG. 2 illustrates a phase locked loop synthesizer and calibration device according to an embodiment of the present invention.

FIG. 2 shows the dual port synthesiser 107, arranged as a phase locked loop, and the calibration module 104 for generating the estimate of the time and gain mismatch between the high input port and the low input port.

The high input port 108, for handling high frequency signals from the polar modulator 101, is coupled to a DAC 201 for converting a digital output signal from the polar modulator 101 into an analogue signal. In a preferred embodiment the output from the DAC 201 is coupled to a pulse shaping filter 202 for controlling the spectral properties of the high port signal. The pulse shaping filter 202 is coupled to a voltage controlled oscillator VCO 203 for converting the received analogue signal into a RF signal, where the frequency of the RF signal is determined by the signal applied to the input of the VCO 203. The VCO 203 is coupled to a first input of a summing node 204. As would be appreciated by a person skilled in the art the summing node 204 is conceptual in nature and is shown in FIG. 2 for ease of description.

Additionally the dual port synthesiser 107 includes a second VCO 205 which is used to generate a RF signal derived from the low input port 109, as described below. The output signal of the second VCO 205 is provided to a second input of the summing node 204. In practice a single VCO could be used which has a dual input, one for the low port and one for the high port.

The output from the summing node 204 provides the output RF signal having a phase $\Phi_o$ from the dual port synthesiser 107. Additionally, the output from the summing node 204 is coupled to a first input of a phase/frequency detector 206 via a frequency divider 207, which acts as the feedback path for the phase locked loop.

The frequency divider 207 is coupled to the low input port 109 of the dual port synthesiser 107 where the digital data bits from the polar modulator 101 control the dividing factor of the frequency divider 207, thereby determining the locking frequency of the phase locked loop.

The phase/frequency detector 206 has a second input for applying a reference signal, which is provided, for example, by a crystal oscillator.

The phase/frequency detector 206 produces an error output signal that is related to the difference in a component of the reference signal, for example, the phase, and the feedback output signal from the summing node 204. The error output signal takes the form of current pulses. The error output signal is provided to a loop filter 208, for example a passive low pass filter, that converts the pulse currents into a tuning line voltage. If the high port and low port dynamics are matched the ac tuning line voltage will be zero, however if the high port dynamics and low port dynamics are mismatched the ac tuning line voltage will be non-zero.

The tuning line voltage is then applied to the VCO input 205, to control the frequency of the VCO output frequency. Consequently, the VCO output frequency is phase locked to the reference signal with the frequency divider 207 determining what multiple of the reference frequency the VCO output frequency corresponds to.

The closed loop of the synthesiser has a transfer function of:

$$\frac{\Phi_o(s)}{X_I(s)} = \frac{G_{ol}}{1+G_{ol}}\hat{k}_h e^{-s\hat{\tau}_D} + \frac{H(s)k_h}{1+G_{ol}} \quad (1.1)$$

where $G_{ol}$ is the low port open loop transfer function and $H(s)$ is the filtering action along the high port, $X_I(s)$ is the input signal to the synthesiser, $\hat{k}_h$ is the estimate of the gain along the high port, $k_h$ is the gain along the high port, $e^{-s\tau_D}$ is the differential time delay between the high and low ports and $\Phi_o(s)$ is output phase from the synthesiser.

The phase error between the reference signal and the feedback signal is given by:

$$\Phi_e(s) = X_I(s)\hat{k}_h e^{-s\hat{\tau}_D} - \Phi_o(s) \quad (1.2)$$

$$= \frac{X_I(s)}{1+G_{ol}}\{\hat{k}_h e^{-s\hat{\tau}_D} - k_h H(s)\}$$

With the corresponding tuning line voltage given by:

$$V_t(s) = \frac{G_{ol}}{k_l}\Phi_e(s) = X_I(s)\frac{G_{cl}}{k_l}\{\hat{k}_h e^{-s\hat{\tau}_D} - k_h H(s)\} \quad (1.3)$$

The calibration device 104 includes a band pass filter 209, which includes an ADC (not shown) for converting the analogy tuning line voltage into a digital signal, that has an input coupled to the output of the loop filter 208 and an output coupled to an estimator 210. Additionally, the calibration device 104 also includes a digital local oscillator 211 DLO, with a programmable phase offset, that is coupled to an input of the estimator 210, the low port 109 of the dual port synthesiser 107 via the programmable digital time delay module 111 and the programmable digital gain module 110 and the high port 108 of the dual port synthesiser 107.

Whereas FIG. 1 illustrates the polar transmitter 100 configured for use in operation showing the am and pm paths time aligned, the high port pm path 108 gain calibrated and the high and low pm paths 108, 109 time aligned, FIG. 2 shows the system configuration while estimating the high port gain and the high port/low port time alignment. This is the estimation stage from which gain and time alignment values are derived. These values are then used to gain calibrate the high port 108 and time align the high and low pm paths 108, 109. Accordingly, the gain value derived during the calibration phase using gain adjustment in the low port 109 will be the inverse of the value programmed into the programmable digital gain module 110 during the operational stage.

The DLO 211 is arranged to generate a digital calibration tone, for example A sin ωn, which is provided to the high port 108, the low port 109 and the estimator 210.

The band pass filter 209 is used to remove the dc content from the tuning line voltage and to remove any high frequency components. The resulting filtered tuning line voltage corresponds to an error signal e(n) which is provided to the estimator 210.

The transfer function of the band pass filter 209 is given by $H_v$. Accordingly, the error term extracted from the tuning line voltage, by the use of the band pass filter 209, provides an estimation error of the time delay and gain mismatch between the high input port path and low input port path and is given by:

$$E(s) = -H_v V_t(s) \quad (1.4)$$

$$= X_I(s)\frac{H_v G_{cl}}{k_l}\{k_h H(s) - \hat{k}_h e^{-s\hat{\tau}_D}\}$$

$$= -\frac{H_v G_{cl}}{k_l}\{V_h(s) - \hat{V}_h(s)\}$$

$$\Rightarrow \hat{e}(t) = -g_v(t) \otimes \{v_h(t) - \hat{v}_h(t)\}$$

where $v_h(t)$ is the high port response and $\hat{v}_h(t)$ is the estimated high port response and $g_v(t)$ is the impulse response of $$\frac{H_v G_{cl}}{k_l}.$$

Accordingly, this provides:

$$v_t(t) = \hat{e}(t) = -g_v(t) \otimes e(t) \quad (1.5)$$

As can be seen the difference between the ideal and the synthesiser system is the filtering of the estimation error.

Using the error signal ê(t) derived from DLO calibration tone being applied to the high input port 108 and the low input port 109 the estimator 210 uses a two dimensional estimation algorithm, for example a least mean squared LMS recursive algorithm, to solve a parameter estimation problem to derive an estimate for gain and time delay mismatch between the high port path and the low port path of the dual port synthesiser 107.

The LMS algorithm can be viewed as a hill descent or search algorithm whose purpose is to descend along the instantaneous gradient of the error surface to where the gradient is zero, i.e. the minimum and thereby minimise both the gain and time alignment mismatch errors.

The basic LMS algorithm can be expressed as:

$$\hat{\Theta}(n+1) = \hat{\Theta}(n) - \frac{\mu}{2}\hat{\nabla}(n) \quad (2.1.a)$$

where $\hat{\Theta}(n)$ is a vector of parameter estimates, for this problem, that is to say $\hat{\Theta}=[\hat{k}_h, \hat{\tau}_D]^T$ where $\hat{\tau}_D$ is the estimate of the high port delay (i.e. the time delay mismatch between the high port and low port) and
$\hat{k}_h$ is the estimate of the high port gain; $\mu$ is the 'step-size' and a scalar constant chosen to control convergence dynamics and steady state accuracy and $\hat{\nabla}(n)$ is the instantaneous or stochastic gradient given by $$\hat{\nabla}(n) = \frac{\delta e^2(n)}{\delta \hat{\Theta}(n)} = \frac{\delta e^2(n)}{\delta e(n)}\frac{\delta e(n)}{\delta \hat{\Theta}(n)} = 2\frac{\partial e(n)}{\partial \hat{\Theta}(n)}e(n) \quad (2.1.b)$$

Combining (2.1.a) and (2.1.b) provides the following equation:

$$\hat{\Theta}(n+1) = \hat{\Theta}(n) - \mu \frac{\delta e(n)}{\delta \hat{\Theta}(n)}e(n) \quad (2.1.c)$$

The central component to implement this algorithm is the gradient term, which from (2.1.b) is composed of the instantaneous estimation error and the partial derivative of the error with respect to the estimates. For this particular problem, the error is given by:

$$E(s) = \{H(s)k_h - e^{-s\hat{\tau}_D}\hat{k}_h\}X(s) \quad (2.2)$$

$$\Rightarrow e(t) = v_h(t) - \hat{v}_h(t)$$

where $v_h(t)$ is the response of the high port and $\hat{v}_h(t)=\hat{k}_h x(t-\hat{\tau}_D)$ is the estimated or model response where the tuning line voltage can be used as an approximation to this error term, as described below. The vector of partial derivatives of the error term with respect to the current estimated parameters is given by:

$$\frac{\delta e(n)}{\delta \hat{\Theta}(n)} = \begin{bmatrix} \frac{\delta e(n)}{\delta \hat{k}_h} \\ \frac{\delta e(n)}{\delta \hat{\tau}_D} \end{bmatrix} = -\begin{bmatrix} \frac{\delta \hat{v}_h}{\delta \hat{k}_h} \\ \frac{\delta \hat{v}_h}{\delta \hat{\tau}_D} \end{bmatrix} = -\begin{bmatrix} x(n-\hat{\tau}_D) \\ \hat{k}_h \frac{\delta x(n-\hat{\tau}_D)}{\delta \hat{\tau}_D} \end{bmatrix} \quad (2.3)$$

For the case where the test signal is a single tone, $x(n)=A \sin \omega n$, (where $\omega=2\pi f_{cal}/f_s$, $f_{cal}$ is the calibration tone frequency and $f_s$ is the underlying sample frequency) the vector becomes $$\frac{\delta e(n)}{\delta \hat{\Theta}(n)} = \begin{bmatrix} -\sin(\omega n - \omega \hat{\tau}_D) \\ \hat{k}_h \omega \cos(\omega n - \omega \hat{\tau}_D) \end{bmatrix} \quad (2.4)$$

The LMS or instantaneous gradient is then given by $$\frac{\hat{\nabla}}{2} = \begin{bmatrix} -\sin(\omega n - \omega \hat{\tau}_D) \\ \hat{k}_h \omega \cos(\omega n - \omega \hat{\tau}_D) \end{bmatrix} e(n) \quad (2.5)$$

Accordingly, the instantaneous gradient of the negative, sampled filtered tuning line voltage is given by:

$$\frac{\hat{\nabla}(n)}{2} = \begin{bmatrix} \frac{\delta \hat{e}(n)}{\delta \hat{k}_h} \\ \frac{\delta \hat{e}(n)}{\delta \hat{\tau}_D} \end{bmatrix} \hat{e}(n) = g_v(n) \otimes \begin{bmatrix} \frac{\delta \hat{v}_h}{\delta \hat{k}_h} \\ \frac{\delta \hat{v}_h}{\delta \hat{\tau}_D} \end{bmatrix} \hat{e}(n) \quad (3.1)$$

For tonal stimulus, $x(n)=\sin(\omega n)$ (see (2.4)) the gradient reduces to $$\frac{\hat{\nabla}(n)}{2} = -g_v(n) \otimes \begin{bmatrix} -\sin(\omega n - \omega \hat{\tau}_D) \\ \hat{k}_k \cos(\omega n - \omega \hat{\tau}_D) \end{bmatrix} \hat{e}(n) \quad (3.2)$$

Substituting the synthesiser variant of the stochastic gradient (3.1) into the standard LMS algorithm (2.1) yields the high port estimation algorithm $$\begin{bmatrix} \hat{k}_h(n+1) \\ \hat{\tau}_D(n+1) \end{bmatrix} = \begin{bmatrix} \hat{k}_h(n) \\ \hat{\tau}_D(n) \end{bmatrix} - \mu \begin{bmatrix} \frac{\delta \hat{v}_k}{\delta \hat{k}_h} \\ \frac{\delta \hat{v}_k}{\delta \hat{\tau}_D} \end{bmatrix} \hat{e}(n) \quad (4.1)$$

For a tonal stimulus (3.2) this becomes $$\begin{bmatrix} \hat{k}_h(n+1) \\ \hat{\tau}_D(n+1) \end{bmatrix} = \begin{bmatrix} \hat{k}_h(n) \\ \hat{\tau}_D(n) \end{bmatrix} - \mu g_v(n) \otimes \begin{bmatrix} -\sin(\omega n - \omega \hat{\tau}_D) \\ \hat{k}_h \cos(\omega n - \omega \hat{\tau}_D) \end{bmatrix} \hat{e}(n) \quad (4.2)$$

This algorithm is immediately realisable except for the filtering action of $g_v(n)$. However, as only the sin and cosine terms must be filtered, the filtering action can be modelled by the gain and phase shift at the tonal frequency, i.e.

$$g_v(n)=Z^{-1}\{|G_v(z)||_{z=e^{j\omega}}\} \quad (4.3)$$

The gain effect can be incorporated into the step-size while the phase shift can be realised by delaying the test-tone by $\tau_G$. The resultant equations become $$\begin{bmatrix} \hat{k}_h(n+1) \\ \hat{\tau}_D(n+1) \end{bmatrix} = \begin{bmatrix} \hat{k}_h(n) \\ \hat{\tau}_D(n) \end{bmatrix} + \mu \begin{bmatrix} -\sin\{\omega(n - \hat{\tau}_D - \tau_G)\} \\ \hat{k}_h \omega\{\omega(n - \hat{\tau}_D - \tau_G)\} \end{bmatrix} \hat{e}(n) \quad (4.4)$$

Using separate step-sizes for the respective estimates provides the following LMS estimation equations:

$$\begin{bmatrix} \hat{k}_h(n+1) \\ \hat{\tau}_D(n+1) \end{bmatrix} = \begin{bmatrix} \hat{k}_h(n) \\ \hat{\tau}_D(n) \end{bmatrix} + \begin{bmatrix} \mu_k & 0 \\ 0 & \mu_\tau \end{bmatrix} \begin{bmatrix} -\sin\{\omega(n - \hat{\tau}_D - \tau_G)\} \\ \hat{k}_h \cos\{\omega(n - \hat{\tau}_D - \tau_G)\} \end{bmatrix} \hat{e}(n) \quad (4.5)$$

Note for simplicity, the weighting term (digital tonal frequency) $\omega$ in the delay gradient term is included with its respective step-size, $\mu_\tau$.

An alternative LMS estimation equation, where the gradient term associated with the delay update is weighted by the inverse of the gain estimate, is given by:

$$\begin{bmatrix} \hat{k}_h(n+1) \\ \hat{\tau}_D(n+1) \end{bmatrix} = \begin{bmatrix} \hat{k}_h(n) \\ \hat{\tau}_D(n) \end{bmatrix} + \qquad (4.5.b)$$

$$\begin{bmatrix} \mu_k & 0 \\ 0 & \mu_\tau \end{bmatrix} \begin{bmatrix} -\sin\{\omega(n-\hat{\tau}_D-\tau_G)\} \\ \dfrac{\cos\{\omega(n-\hat{\tau}_D-\tau_G)\}}{\hat{k}_h(n)} \end{bmatrix} \hat{e}(n)$$

The above equations can both be used by the estimator 210 to generate an estimated time delay and gain mismatch between the high input port path and the low input port path.

For the purposes of this embodiment the estimation algorithm is clocked at a 26 MHz rate modulated by the signal output from the frequency divider 207, however, the estimation algorithm can be clocked at other rates.

As stated above, the estimation process, described above, occurs before a transmission burst within a multi slot transmission system, where the calibration occurs as part of the overall synthesiser set up sequence. Once calibration has occurred the calibration module 104 is arranged to configure the programmable digital time delay element 111 and the programmable digital gain element 110 to compensate for the time delay mismatch and gain mismatch between the high port path and low port path of the dual port synthesiser 107 ready for transmitting a data stream within a multi slot where a sequencer (not shown) is used to interleave the calibration process within the overall transmission sequence. Within this embodiment the low port signal will be delayed by $\hat{\tau}_D$ and the high port gain is normalised by scaling the high port signal by $1/\hat{k}_h$. Alternatively, in the case where the delay estimate result is negative then the high port is delayed by $|\hat{\tau}_D|$.

In addition to the calibration module 104 being arranged to generate an estimate of the gain and time delay mismatch between the high port and low port of the synthesiser the calibration module 104 can also be used to determine an estimate of the time delay between the AM path and the PM path for the polar transmitter 100.

Figure 3:
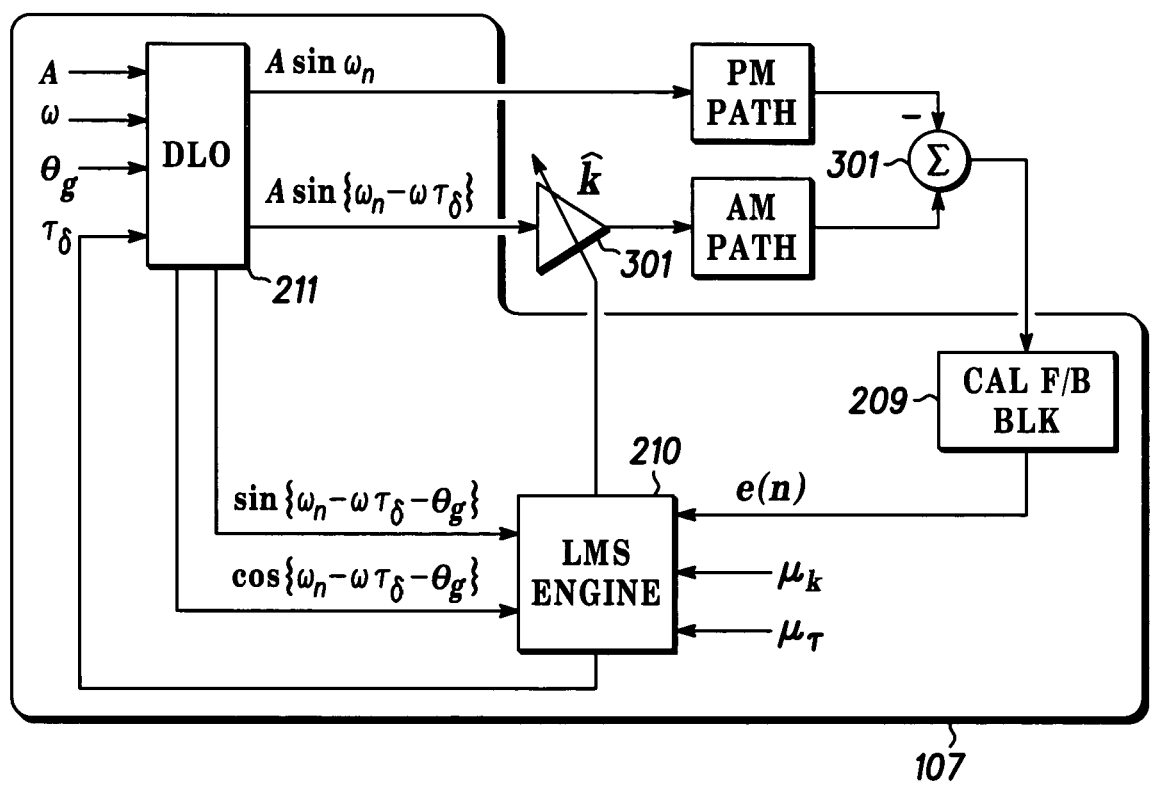
FIG. 3 illustrates apparatus for performing am to pm mismatch estimation according to an embodiment of the present invention.

FIG. 3 illustrates the calibration module 107 coupled to the AM path and the PM path of the polar transmitter 100 for performing estimation of the time delay mismatch between the AM path and the PM path. The DLO 211 is coupled to the AM path, via the digital programmable gain element 301 and to the PM path.

The only significant mismatch factor for the am and pm paths is time alignment; as such gain mismatch can be ignored. However, as the calibration module uses a two dimensional estimation algorithm the digital programmable gain element 301 is used to allow the algorithm to converge. An alternative solution for the am and pm mismatch estimation would be to use a one dimensional algorithm.

The PM path output and AM path output are input to a summation node 301 where the AM path output is subtracted from the PM path output. The output from the summation node 301 is feed to the band pass filter 209 that is used to filter out the dc content and the high frequency components to leave an error signal that corresponds to the ac content of the tuning line voltage. The output from the band pass filter 209 is feed to the estimator 210, which also receives an input from the DLO 211.

The DLO 211 is programmed with the desired amplitude A, frequency ω and phase delay of the analog processing $\theta_g$ and generates a calibration tone. $\theta_g$ is the phase delay corresponding to the delay $\tau_G$ The calibration tone generated by the DLO 211, Asinωn, is injected into the high port 108 of the dual port synthesiser 107, with the response tapped off at the high port VCO input. A delayed version of the calibration tone is injected into the AM path with the response tapped off prior to the AM buffer 106. The respective output signals are feed to the summation node 301 that generates a tuning line voltage that is supplied to the band pass filter 209 where, as described above, the tuning line voltage represents an error signal of the mismatch between the AM path and the PM path. The resultant error signal output from the band pass filter 209 is then used to drive the two dimensional estimation algorithm within the estimator 210 exactly as per the dual port synthesiser 107, describe above. The estimator 210 then adapts the delay of the AM path $\hat{\tau}_\delta$, via a variable phase offset in the DLO 211, and gain $\hat{k}$ so as to minimise the mean squared power of the error between the paths. This effectively equalises the group delay and gain of the two paths at the tone frequency.

The embodiment shown in FIG. 3 for correcting the time mismatch between the am and pm path uses a variable phase offset in the DLO 211 during the calibration stage to determine the mismatch, which is then used to programme the programmable digital time delay module 111 during operational use. This generation of time delay during the calibration process could also be implement for the estimation of the time delay mismatch between the high port and the low port 108, 109.

The gain estimate $\hat{k}$ is incidental and is only required to ensure the accurate convergence of the delay estimate. Furthermore, the gain differential between the two paths should be known reasonably accurately apriori as its primary set by the high port attenuator. Accordingly, the initial AM path gain estimate could be set to match this gain. Alternatively, and more preferably, the AM path could contain a programmable digital gain set to equalise the gains with the estimation algorithm estimate then fine tuning the gain matching.

During the transmission phase both PM paths are delayed by an amount $\tau_\delta$ Tref for $\hat{\tau}_\delta > 0$ otherwise the AM path is delayed.

We claim:

1. A calibration device for a phase locked loop arranged to generate an output frequency based upon a first frequency range of an input signal applied to a first input and a second frequency range of the input signal applied to a second input, the calibration device comprising an estimator arranged to use a two dimensional estimation algorithm with a signal value indicative of a mismatch between the first input path and the second input path to determine an estimate of the mismatch to allow matching of the first input path and the second input path, wherein:

one dimension of the two dimensional estimation algorithm is arranged to estimate a gain mismatch between the first input path and the second input path and the second dimension of the two dimensional estimation algorithm is arranged to estimate a time delay between the first input path and the second input path; and the two dimensional estimation algorithm takes the form of:

$$\begin{bmatrix} \hat{k}_h(n+1) \\ \hat{\tau}_D(n+1) \end{bmatrix} = \begin{bmatrix} \hat{k}_h(n) \\ \hat{\tau}_D(n) \end{bmatrix} + \begin{bmatrix} \mu_k & 0 \\ 0 & \mu_\tau \end{bmatrix} \begin{bmatrix} -\sin\{\omega(n-\hat{\tau}_D(n)-\tau_G)\} \\ \hat{k}_h \cos\{\omega(n-\hat{\tau}_D(n)-\tau_G)\} \end{bmatrix} \hat{e}(n)$$

where:

$\hat{e}(n)$ is a sampled tuning voltage, $\tau_G$ is the approximate group delay through the low port to the sampled, digitally processed tuning voltage, ω is a test tone frequency, $\mu_\tau$ and $\mu_k$ are scalar constants that control calibration transients, $\hat{\tau}_D$ is the estimate of the high port delay and $\hat{k}_h$ is the estimate of the high port gain.

2. A calibration device according to claim 1, further comprising a detector arranged on the occurrence of a test tone being applied to the first input and the second input to generate a signal indicative of a mismatch between the first input path and the second input path.

3. A calibration device according to claim 2, wherein the detector comprises a phase comparator for comparing a reference phase with a representation of an output phase to generate an output signal indicative of a mismatch between the first input path and the second input path and a loop filter for converting the phase comparator output to a tuning voltage that is utilized to provide a signal value indicative of a mismatch between the first input path and the second input path to the estimator.

4. A calibration device according to claim 1, wherein the two dimensional estimation algorithm is a Least Mean Square algorithm based upon an instantaneous or stochastic gradient term.

5. A calibration device according to claim 4, wherein the instantaneous or stochastic gradient term is:

$$\hat{\nabla}(n) = \frac{\delta e^2(n)}{\delta \hat{\Theta}(n)} = \frac{\delta e^2(n)}{\delta e(n)} \frac{\delta e(n)}{\delta \hat{\Theta}(n)} = 2 \frac{\delta e(n)}{\delta \hat{\Theta}(n)} e(n)$$

where:

$\hat{\Theta}(n)$ is a vector of parameter estimates; and $e(n)$ is an instantaneous estimation error.

6. A calibration device according to claim 1, wherein the phase locked loop comprises a loop filter for generating a tuning voltage that is utilized to provide a signal value indicative of a mismatch between the first input path and the second input path to the estimator.

* * * * *